United States Patent [19]

Cense

[11] 4,287,476
[45] Sep. 1, 1981

[54] CONTROL CIRCUIT

[75] Inventor: Adriaan Cense, Nijmegen, Netherlands

[73] Assignee: U.S. Philips Corporation, New York, N.Y.

[21] Appl. No.: 23,220

[22] Filed: Mar. 23, 1979

[30] Foreign Application Priority Data

Apr. 4, 1978 [NL] Netherlands .......................... 7803561

[51] Int. Cl.³ .......................... H03F 3/45; H03G 3/32
[52] U.S. Cl. ................................................. 330/254
[58] Field of Search .................. 330/254; 358/27, 174, 358/176, 178

[56] References Cited

U.S. PATENT DOCUMENTS

| 3,750,042 | 7/1973 | Deil et al. ............................ 330/254 |
| 3,921,091 | 11/1975 | Van Kessel et al. ................ 330/254 |

Primary Examiner—James B. Mullins
Attorney, Agent, or Firm—William J. Streeter; Bernard Franzblau

[57] ABSTRACT

In a control circuit having an emitter-coupled pair of transistors, to the base whereof a control voltage is supplied and whose emitter circuit is controlled by a signal source, the control voltage is also supplied to the emitter circuit to obtain a lower direct current through the transistor pair for a larger gain so that unwanted variations in the output d.c. voltage level are reduced.

13 Claims, 1 Drawing Figure

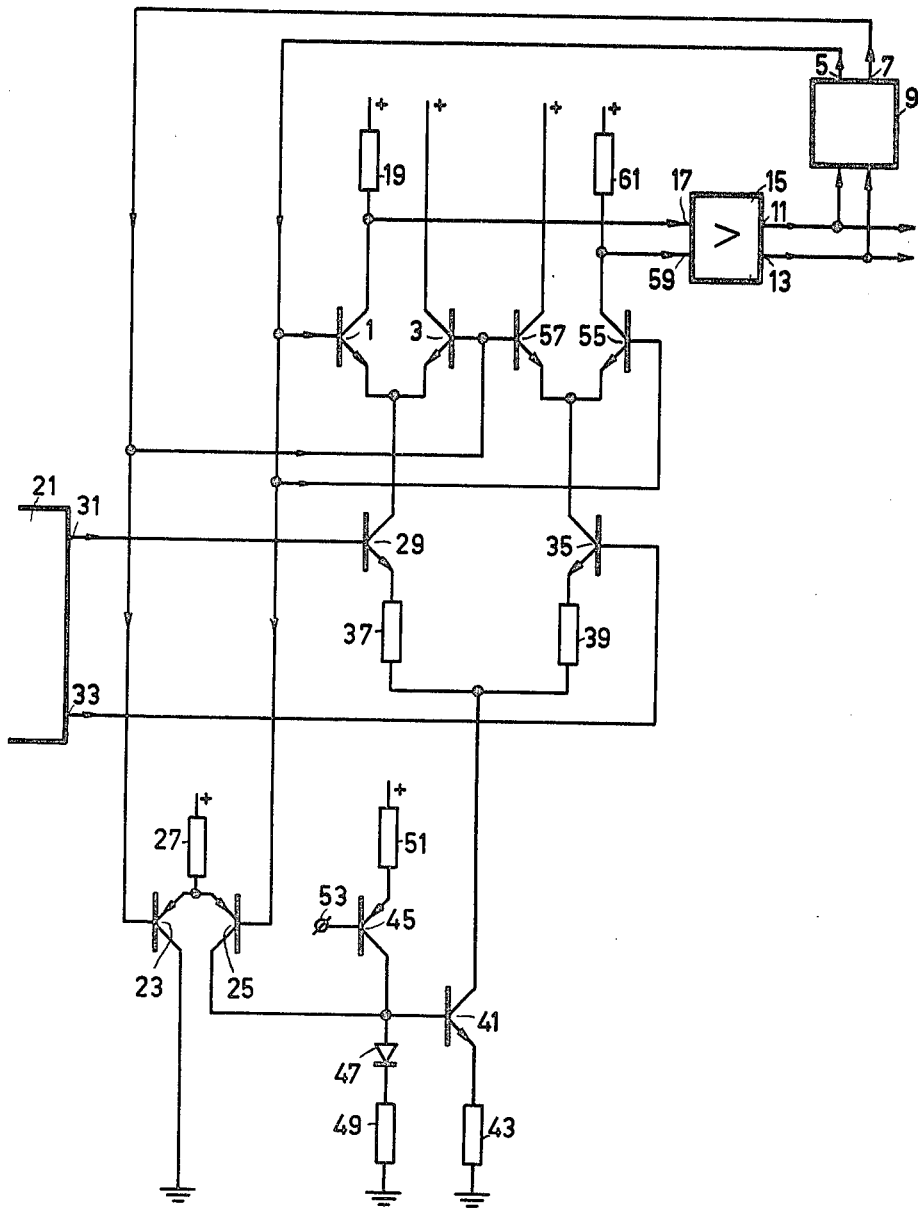

CONTROL CIRCUIT

The invention relates to a control circuit having an input and to a signal source, is coupled to the emitters of a first and a second transistor, the bases of these first and second transistors being coupled to a control signal source and a collector of the first or the second transistor being coupled to an output of the control circuit for obtaining a signal having an amplitude influenced by the control signal source, which control circuit comprises a circuit. This carries direct current only and is influenced by the control signal source for matching the direct current component in the signal to be obtained from the output.

The German Patent Specification No. 2021023 discloses a control circuit of the type defined above wherein the circuit for matching the direct current component is constituted by a pair of transistors, whose bases are also driven by the control signal source and which have intercoupled emitters to which a direct current is supplied, and a collector whereof is coupled to the output. This pair of transistors produces a direct current at the output which increases according as the direct current produced by the first or the second transistor increases and the other way round, so that the direct current level at the output remains substantially constant. A further stabilization of the direct current level is effected by an automatic control loop which obtains a signal from the emitter circuits of the two pairs of transistors. This automatic control loop is a keyed control loop and requires a smoothing circuit which requires an extra connection if the circuit is integrated.

It is an object of the invention to eliminate the use of an extra connection.

In accordance with the invention a control circuit of the type defined in the preamble is therefore characterized in that the circuit for matching the direct current component is included in the emitter circuit of the first and second transistor.

The invention is based on the concept that control circuits generally serve to keep the amplitude of the signal at the output approximately constant if the amplitude of the input signal can assume different values. If a higher gain of the control circuit is required with a smaller input signal amplitude, this means that the collector circuit of the first or the second transistor in the known circuits would start carrying a larger direct current which is not necessary since the input signal has become smaller. In the control circuits according to the invention the direct current component is therefore controlled in the relevant transistor into the opposite sense of the gain of the control circuit by controlling the direct current supplied to the coupled emitters of the first and the second transistors. If the control circuit is implemented as a balanced circuit, the result is that the risk that the circuit becomes unbalanced at a larger gain does not increase because the direct current supplied to the emitters of the first and the second transistors decreases.

The invention will now be further explained with reference to the accompanying drawing.

The drawing comprises one FIGURE only, which is a diagrammatic representation of a possible implementation of a control circuit according to the invention.

In the FIGURE a control signal originating from an output 5,7 of a detection circuit 9 is applied between the bases of a first transistor 1 and a second transistor 3. This detection circuit 9 is supplied with a signal obtained from an output 11, 13 of a differential amplifier 15 having an input 17 connected to the collector of the first transistor 1 and, in addition, to a positive supply voltage through a resistor 19.

The emitters of the first and the second transistors 1, 3 are interconnected and controlled from a signal source 21 in a manner which will be discussed in the further course of this description.

The control signal originating from the output 5, 7 of the detection circuit 9 is also applied to the bases of a third transistor 23 and a fourth transistor 25. The emitters of these transistors 23, 25 are connected to a positive supply voltage via a common resistor 27. The collector of the third transistor 23 is grounded and that of the fourth transistor 25 supplies a direct current, influencable by the control signal, to the emitter circuit of the first and the second transistors 1, 3.

The emitters of the first and the second transistors 1, 3 are connected to the collector of a fifth transistor 29 whose base is connected to an output 31 of the signal source 21. A further output 33 of the signal source 21 is connected to the base of a sixth transistor 35. The emitters of the fifth and the sixth transistors 29, 35 are connected through resistors 37, 39 to the collector of a seventh transistor 41. The outputs 31, 33 of the signal source have the same d.c. voltage level.

At least one of the outputs 31, 33 of the signal source 21 supplies, in addition, a signal, for example a chrominance signal in a colour television receiver, so that the fifth and the sixth transistor are driven in opposite phase.

The seventh transistor 41 supplies a direct current to the emitters of the fifth and the sixth transistors 29, 35, this current being distributed in equal quantities over the fifth and the sixth transistors 29, 35 owing to the equal d.c. voltage levels at the outputs 31 and 33 of the signal source 21. The emitter of the seventh transistor is connected to ground through a resistor 43, its base is connected to the collector of the fourth transistor 25, to the collector of an eighth transistor 45 and to ground through a series arrangement of a diode 47 and a resistor 49. The emitter of the eighth transistor 45 is connected to the positive supply voltage through a resistor 51 and its base is connected to a point 53 having a suitably chosen d.c. voltage.

Thus, the eighth transistor 45 supplies a constant direct current to the base of the seventh transistor and the fourth transistor 25 supplies a direct current depending on the control signal. If the base voltage of the first transistor 1 is increased relative to that of the second transistor 3, a larger portion of the current, supplied by the fifth transistor 29, is fed to the load resistor 19, and the gain of the circuit increases. Simultaneously the direct current through the fourth transistor 25 decreases and, consequently, also the direct current through the seventh transistor 41, the fifth transistor 29, the first transistor 1 and the load resistor 19. The same occurs with the direct current through the sixth transistor 35, whose collector is connected to the emitters of a ninth transistor 55 and a tenth transistor 57. The collector of the ninth transistor is connected to a further input 59 of the differential amplifier 15 and to a positive supply voltage through a load resistor 61. The inputs 17 and 59 of the differential amplifier 15 constitute the outputs of the control circuit. So the d.c. voltage level is matched in equal manner to the inputs 17 and 59 of the differential amplifier 15, whereas they are driven in opposite phase for a.c. voltage by the fifth and sixth transistors 29, 35 in response to the output signal of the signal source 21. If so desired, the matching of the d.c. voltage levels can be chosen so that they remain constant for a change in the gain.

Reducing the direct current to the emitters of the first and the second transistors 1, 3 and of the ninth and tenth transistors 55, 57 at an increasing gain results in that the disturbing influences occurring during the distribution of these currents over the various transistors will be less than when the current is kept constant, so that the drive range of the differential amplifier 15 is not adversely affected.

In the above example the control circuit forms part of the automatic control of the amplitude of a chrominance signal (A.C.C.). The detection circuit then supplies a control signal which is proportional to the amplitude of a burst signal present in the chrominance signal.

It will be obvious that the use of a control circuit according to the invention is not limited to the embodiment described above. Even if the control circuit is not included in a control loop but serves as an adjusting circuit, the direct current matching according to the invention can be utilized.

In a very simple embodiment of a control circuit according to the invention, the sixth, seventh, ninth and tenth transistors 35, 41, 55, 57 can be dispensed with and the direct current through the fifth transistor 29 can be influenced by the control signal applied to the bases of the first and the second transistor.

It is, of course, also possible to extend the circuit, for example by incorporating more transistors in the series arrangement.

What is claimed is:

1. A control circuit comprising first and second transistors each having emitter, base and collector electrodes, input means coupling the emitters of the first and second transistors to a signal source, means coupling the bases of the first and second transistors to a control signal source for controlling the gain of the control circuit and further coupling the collector of one of said transistors to an output of the control circuit for obtaining an output signal thereat having an amplitude controllable by the control signal source, said control circuit further comprising a circuit included in the emitter circuit of the first and second transistors through which a direct current only flows and which is responsive to the control signal source for controlling a direct current component in the output signal in a sense opposite to that of the circuit gain.

2. A control circuit as claimed in claim 1 wherein the circuit for controlling the direct current component includes third and fourth transistors with their emitters intercoupled and the bases of the first and the second transistors are coupled to the bases of the third and fourth transistors, and wherein a collector of one of the third and fourth transistors is coupled to the emitter circuit of the first and second transistors for controlling said direct current component.

3. A control circuit as claimed in claim 1 further comprising a sixth transistor and said emitter circuit includes fifth and seventh transistors and second means coupling the first and the second transistors to a collector of the fifth transistor and the emitter of the fifth transistor to the emitter of the sixth transistor and to a collector of the seventh transistor, wherein the input means couples the signal source to the bases of the fifth and the sixth transistors, third means coupling the collector of the sixth transistor to a source of supply voltage for the control circuit, and wherein the circuit for controlling the direct current component is connected in the base circuit of the seventh transistor.

4. A control circuit as claimed in claim 3 wherein the third coupling means includes a transistor amplifier coupling the collector of the sixth transistor to said output of the control circuit.

5. A gain control circuit for an amplifier comprising, first the second transistors each having emitter, base and collector electrodes, input means for coupling the emitters of the first and second transistors to a source of input signal to be amplified, first means coupling the base electrodes of the first and second transistors to a source of gain control voltage for the amplifier, second means coupling the collector electrodes of the first and second transistors to a source of supply voltage and the collector of the first transistor to an output of the amplifier for deriving thereat an output signal determined by the gain control voltage, and third means coupling the emitters of the first and second transistors to a D.C. circuit through which a direct current only flows, said D.C. circuit including means responsive to the gain control voltage for controlling the direct current component in the collector of the first transistor in a sense opposite to that of the effect of the gain control voltage on said first transistor.

6. A control circuit as claimed in claim 5 wherein said D.C. circuit controlling means comprises third and fourth transistors with their emitters intercoupled to a source of supply voltage, their base electrodes coupled to the source of gain control voltage and the collector of the fourth transistor coupled to the emitters of the first and second transistors for controlling the flow of direct current therein.

7. A control circuit as claimed in claim 6 wherein said third and fourth transistors are of opposite conductivity type to that of the first and second transistors.

8. A control circuit as claimed in claim 6 wherein said input coupling means includes a fifth transistor coupled to the emitters of the first and second transistors and in series therewith and with its base coupled to the input signal source and one main current path electrode thereof coupled to the collector of the fourth transistor whereby said direct current flow is controlled.

9. A control circuit as claimed in claims 5, 6 or 8 further comprising an amplifier and a detector connected in cascade between the amplifier output and said first coupling means thereby to supply the gain control voltage to the base electrodes of the first and second transistors.

10. A control circuit as claimed in claim 6 wherein said input coupling means includes fifth and sixth transistors with the fifth transistor connected to the emitters of the first and second transistors and the sixth transistor coupled to at least an emitter of a further transistor having its collector coupled to said amplifier output and its base coupled to said source of gain control voltage via said first coupling means, the base electrodes of said fifth and sixth transistors being coupled to said input signal source whereby a differential input signal is applied thereto, and wherein said third coupling means couples said fifth and sixth transistors to said D.C. circuit such that direct current components flowing in the collectors of the first and further transistors are controlled in the same sense as a function of the gain control voltage.

11. A control circuit as claimed in claim 5 further comprising a feedback circuit coupling the amplifier output to said D.C. circuit and to said first coupling means for supplying the gain control voltage to the D.C. circuit and to the base electrodes of the first and second transistors.

12. A control circuit as claimed in claim 5 wherein said D.C. circuit controlling means comprises third and fourth transistors with their emitters intercoupled to a source of supply voltage and their base electrodes coupled to the source of gain control voltage, said first coupling means includes a fifth transistor coupled to the emitters of the first and second transistors and in series therewith and with its base coupled to the input signal source, and a seventh transistor having an output electrode coupled to the fifth transistor and a control electrode coupled to the collector of the fourth transistor whereby said direct current flow is controlled.

13. A gain control circuit comprising, first and second transistors each having emitter, base and collector electrodes, input means for coupling the emitters of the first and second transistors in common to a source of input signal, first means coupling the base electrodes of the first and second transistors to a source of gain control voltage, second means coupling the collector electrodes of the first and second transistors to a source of supply voltage and the collector of the first transistor to an output for deriving thereat an output signal determined by the gain control voltage, and third means coupling the emitters of the first and second transistors to the output of a circuit for controlling the flow of D.C. current in the collector of the first transistor, said D.C. current controlling circuit having an input coupled to said source of gain control voltage and means responsive thereto for controlling the direct current component in the collector of the first transistor in a sense opposite to that of the effect of the gain control voltage on said first transistor.

* * * * *